(12) United States Patent
Kishimoto et al.

(10) Patent No.: US 8,092,640 B2
(45) Date of Patent: Jan. 10, 2012

(54) PLASMA PROCESSING APPARATUS AND SEMICONDUCTOR DEVICE MANUFACTURED BY THE SAME APPARATUS

(75) Inventors: Katsushi Kishimoto, Kyoto (JP); Yusuke Fukuoka, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 41 days.

(21) Appl. No.: 11/328,461

(22) Filed: Jan. 10, 2006

(65) Prior Publication Data

US 2006/0191480 A1    Aug. 31, 2006

(30) Foreign Application Priority Data

Jan. 13, 2005    (JP) .................................. 2005-006598

(51) Int. Cl.
*C23F 1/00* (2006.01)
*H01L 21/306* (2006.01)
*C23C 16/455* (2006.01)
*C23C 16/50* (2006.01)
*C23C 16/505* (2006.01)
*C23C 16/509* (2006.01)
*C23C 16/06* (2006.01)
*C23C 16/22* (2006.01)

(52) U.S. Cl. ......... 156/345.33; 156/345.43; 156/345.44; 156/345.45; 156/345.46; 156/345.47; 118/723 E; 118/723 ER (58) Field of Classification Search ............... 118/723 E, 118/723 ER; 156/345.43, 345.44, 345.45, 156/345.46, 345.47, 345.33

See application file for complete search history.

(56) References Cited

U.S. PATENT DOCUMENTS

| | | | |
|---|---|---|---|
| 4,264,393 A | | 4/1981 | Gorin et al. |
| 4,287,851 A | | 9/1981 | Dozier |
| 4,292,153 A | | 9/1981 | Kudo et al. |
| 4,364,617 A | * | 12/1982 | Moriwaki et al. .............. 445/53 |
| 4,381,965 A | | 5/1983 | Maher et al. |
| 4,618,477 A | * | 10/1986 | Babu et al. .............. 422/186.29 |
| 4,633,811 A | | 1/1987 | Maruyama |
| 4,664,890 A | | 5/1987 | Tawada et al. |
| 4,668,338 A | * | 5/1987 | Maydan et al. .............. 438/714 |

(Continued)

FOREIGN PATENT DOCUMENTS

EP    0 689 226 A1    12/1995

(Continued)

OTHER PUBLICATIONS

European Search Report mailed Jun. 1, 2006 in EP Application No. 06000502.2.

(Continued)

*Primary Examiner* — Rudy Zervigon
(74) *Attorney, Agent, or Firm* — Nixon & Vanderhye P.C.

(57) ABSTRACT

A plasma processing apparatus of this invention includes a sealable chamber, a gas supply source of reactive material gas, placed outside the chamber, a gas introduction pipe connected to the gas supply source, for introducing the material gas into the chamber, and a plurality of sets of cathode-anode bodies for forming a plurality of discharge spaces which perform plasma discharge of the material gas in the chamber. Herein, the gas introduction pipe includes a gas branch section arranged in the chamber, a main pipe for connecting the gas supply source to the gas branch section, and a plurality of branch pipes connected from the main pipe to each of the discharge spaces via the gas branch section. The branch pipes are configured so that conductances thereof are substantially equivalent to each other.

20 Claims, 5 Drawing Sheets

U.S. PATENT DOCUMENTS

| | | | |
|---|---|---|---|
| 4,676,865 A | 6/1987 | DeLarge | |
| 4,825,806 A | 5/1989 | Tawada et al. | |
| 4,887,005 A | 12/1989 | Rough et al. | |
| 5,041,201 A | 8/1991 | Yamazaki et al. | |
| 5,061,359 A | 10/1991 | Babu et al. | |
| 5,082,547 A | 1/1992 | DeLarge | |
| 5,515,986 A | 5/1996 | Turlot et al. | |
| 5,653,810 A | 8/1997 | Kataoka et al. | |
| 5,753,886 A | 5/1998 | Iwamura et al. | |
| 5,795,452 A | 8/1998 | Konoshita et al. | |
| 5,834,730 A | 11/1998 | Suzuki et al. | |
| 5,958,141 A | 9/1999 | Kitabatake et al. | |
| 6,017,396 A | 1/2000 | Okamoto | |
| 6,189,485 B1 | 2/2001 | Matsuda et al. | |
| 6,349,670 B1 | 2/2002 | Nakano et al. | |
| 6,435,130 B1 * | 8/2002 | Takaki et al. | 118/723 E |
| 6,846,364 B2 * | 1/2005 | Pyo | 118/725 |
| 7,591,907 B2 * | 9/2009 | Chen et al. | 118/715 |
| 2002/0014204 A1 * | 2/2002 | Pyo | 118/715 |
| 2003/0155332 A1 | 8/2003 | Datta et al. | |
| 2003/0164143 A1 | 9/2003 | Toyoda et al. | |
| 2004/0187785 A1 | 9/2004 | Kishimoto et al. | |
| 2006/0087211 A1 | 4/2006 | Kishimoto et al. | |
| 2006/0137610 A1 * | 6/2006 | Yoshizaki et al. | 118/723 E |
| 2006/0191480 A1 | 8/2006 | Kishimoto et al. | |
| 2007/0193688 A1 * | 8/2007 | Dhindsa et al. | 156/345.43 |

FOREIGN PATENT DOCUMENTS

| | | | |
|---|---|---|---|
| JP | 54-106081 A | | 8/1979 |
| JP | 60-924 U | | 1/1985 |
| JP | 61-214513 A | | 9/1986 |
| JP | 01047875 A | * | 2/1989 |
| JP | 4-164895 | | 6/1992 |
| JP | 9-209151 A | | 8/1997 |
| JP | 2000-294511 A | | 10/2000 |
| JP | 2001-85409 A | | 3/2001 |
| JP | 2004-259853 A | | 9/2004 |
| WO | 2005/045873 A2 | | 5/2005 |

OTHER PUBLICATIONS

U.S. Office Action mailed Oct. 5, 2007 in U.S. Appl. No. 10/787,748.
U.S. Office Action mailed Jun. 28, 2007 in U.S. Appl. No. 11/328,448.
U.S. Final Office Action mailed Dec. 14, 2007 in U.S. Appl. No. 11/328,448.
U.S. Office Action mailed Dec. 14, 2007 in U.S. Appl. No. 11/252,885.
European Search Report mailed May 12, 2006 in corresponding EP application No. 06000503.0.
Patent Abstracts of Japan, vol. 009, No. 143 (E-322) Jun. 18, 1985 & JP 60 025235 A (Hitachi Seisakusho KK), Feb. 8, 1985.
U.S. Final Office Action mailed Aug. 4, 2008 in corresponding U.S. Appl. No. 11/252,885.

* cited by examiner

PLASMA PROCESSING APPARATUS AND SEMICONDUCTOR DEVICE MANUFACTURED BY THE SAME APPARATUS

CROSS-REFERENCE TO RELATED APPLICATION

This application is related to Japanese Patent Application No. 2005-006598 filed on Jan. 13, 2005, on the basis of which priority is claimed under 35 USC §119, the disclosure of this application being incorporated by reference in its entirety.

BACKGROUND OF THE INVENTION

1. Field of the Invention

The disclosed technology relates to a plasma processing apparatus and a semiconductor device manufactured by the same apparatus. More particularly, the disclosed technology relates to a plasma processing apparatus which is for use in manufacturing a semiconductor device by plasma discharge of reactive material gas in a sealable chamber, for example, by processing a substrate which is a material to be processed, and in which a plurality of sets of cathode-anode bodies for performing plasma discharge are provided in the chamber so that a plurality of discharge spaces exist, and also relates to a semiconductor device manufactured by this plasma processing apparatus.

2. Description of the Related Art

Figure 5:
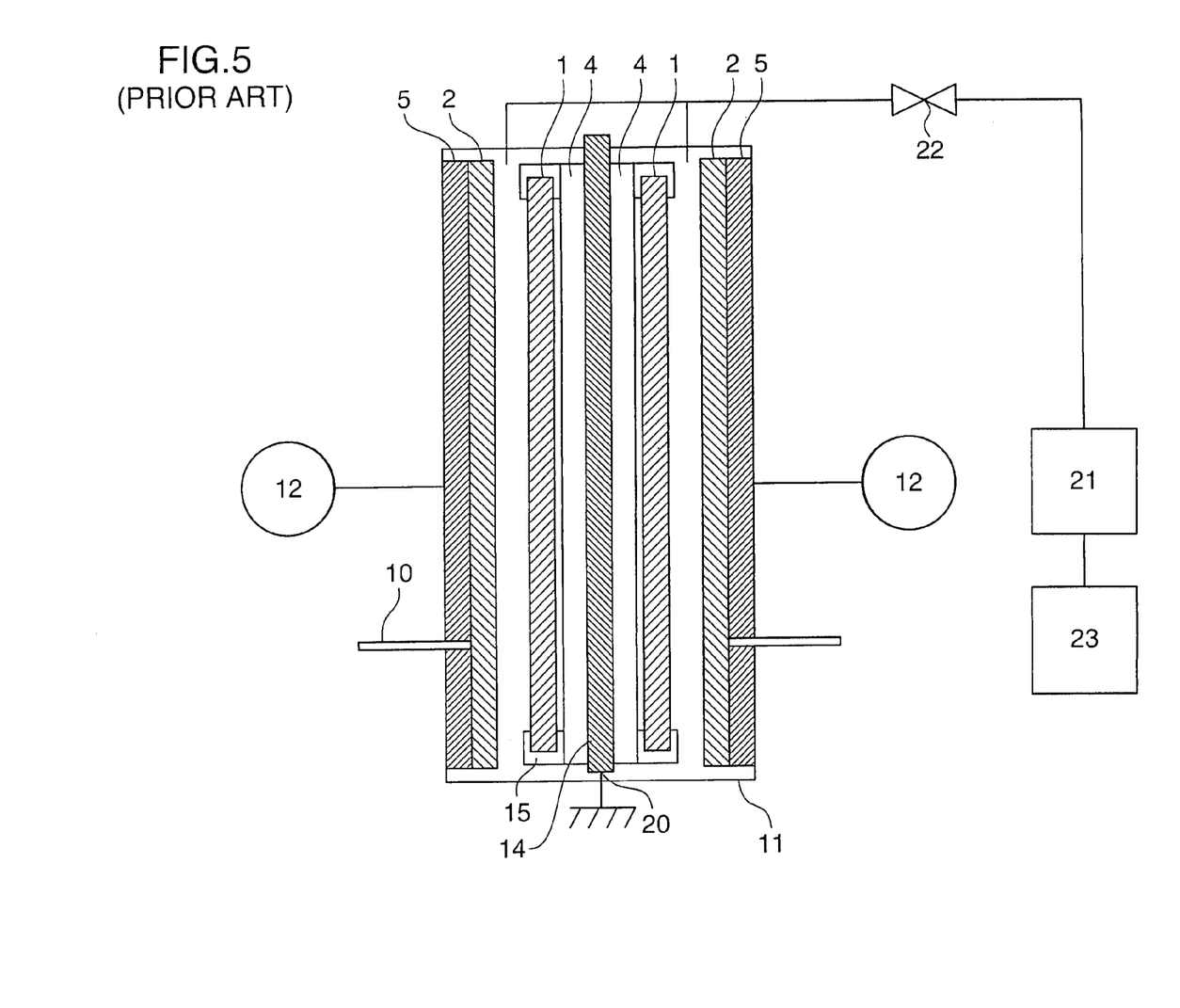
FIG. 5 is a schematic longitudinal sectional view showing a conventional semiconductor device manufacturing apparatus.

A vertical type plasma processing apparatus shown in FIG. 5 is known in the conventional art as a semiconductor device manufacturing apparatus which is a kind of a general plasma processing apparatus.

The semiconductor device manufacturing apparatus shown in FIG. 5 comprises a sealable vertical type chamber 11 as a reactive vessel, and anodes 4, 4 are substantially vertically arranged with respect to a bottom surface of the chamber 11 at its inside center portion. Each of the anodes 4, 4 comes in contact with a heater 14 substantially vertically arranged with respect to the bottom surface of the chamber 11 at its center portion. The heater 14 serves to heat a glass substrate 1 (held by a substrate holding part 15), which is a material to be processed, at a constant temperature, for example, 100° C. to 600° C. The semiconductor device manufacturing apparatus further comprises cathodes 2, 2 which are substantially vertically arranged with respect to the bottom surface of the chamber 11 near the side wall of the inside of the chamber 11.

The semiconductor device manufacturing apparatus will be more specifically described. That is, the anodes 4, 4 and the cathodes 2, 2 are arranged so that the anodes 4, 4 are sandwiched by the cathodes 2, 2 (in a state where two sets of the cathode and anodes are placed opposite) with a predetermined interval in a horizontal direction. Then, plasma discharge is performed at spaces between each of the anodes 4 and each of the cathodes 2 with reactive material gas introduced into the chamber 11.

The chamber 11 and the anodes 4, 4 use material such as stainless steel or aluminum alloy and use ceramics or the like for thermal insulation. Each cathode 2 is arranged so as to face the substrate 1 with a predetermined interval. Furthermore, each cathode 2 is supported by a cathode support 5 made of insulating glass in order to obtain electrical insulation. The heater 14 is grounded via a grounding terminal 20.

It is general that a gas introduction pipe 10 is arranged in a branched manner within a space in a housing where exhaust ventilation is performed outside the chamber 11 in order to evenly supply material gas to a plurality of discharge spaces in the semiconductor device manufacturing apparatus. Furthermore, it is also general that conductance is adjusted by providing a needle valve in each gas introduction pipe 10 after branching in order to improve difference in conductance caused by difference in piping length.

Further, a plurality of gas introduction pipes 10 are arranged by stainless steel pipes with high airtightness between the gas supply source and the chamber 11 and connected to ports located adjacent to individual discharge spaces. Consequently, in the case where gas is introduced to the cathode 2, since insulation needs to be provided between the stainless steel pipe which introduces gas and the cathode, it is required to connect by sandwiching an expensive insulating insulator. Then, gas to be introduced into the discharge space is introduced into the inside of the chamber 11 via the plurality of stainless steel pipes 10. A pressure controller 22 and a vacuum pump 21 are provided in order to flexibly control pressure of reactive gas in the chamber. A toxic substance elimination device 23 is connected to the vacuum pump 21 in order to eliminate toxic substance in exhaust gas.

In addition, as for a conventional plasma processing apparatus, those which improve etching or evaporation uniformity in a plasma chemical technology are known (see, for example, U.S. Pat. No. 4,264,393).

In an apparatus disclosed in U.S. Pat. No. 4,264,393, the number of a gas introduction pipe from a gas supply source to a chamber is one; however, the gas introduction pipe is branched into a plurality of gas introduction pipes which are the same as the number of discharge spaces in the chamber in order to supply gas to the plurality of discharge spaces in the chamber.

The aforementioned conventional plasma processing apparatuses have the following problems.

First, the apparatus shown in FIG. 5 will be described. In this apparatus, the gas introduction pipe 10 is branched within a space in a housing where exhaust ventilation is performed outside the chamber 11. Furthermore, it is also required that a needle valve in each gas introduction pipe 10 after branching is provided for the purpose of improving difference in conductance caused by difference in piping length; therefore, it naturally becomes high cost.

Further, since the plurality of gas introduction pipes 10 are arranged by stainless steel pipes with high airtightness between the gas supply source and the chamber 11 and connected to ports located adjacent to individual discharge spaces, their piping lengths are not less than a plurality of times the distance from the gas supply source to the chamber 11.

The gas introduction pipe 10 is required to use stainless steel pipe with high airtightness because gas to be introduced to the discharge space is accompanied with high danger when gas such as special high pressure gas or hydrogen leaks and the port is required to provide the number corresponding to those of the discharge spaces, resulting in further high cost. Furthermore, since the entire distance of the gas introduction system is long compared to the case where simple connection is made with a single pipe and the number of valves is many, delicate consideration is required for safety of exhaust ventilation at the branch section, and consequently it becomes a serious cost.

Further, in the case where gas is introduced to the cathode 2, since insulation needs to be provided between the stainless steel pipe which introduces gas to the individual discharge spaces and the cathode, it is required to connect by sandwiching an expensive insulating insulator, resulting in high cost. Furthermore, since there is no material having considerably high heat resistance in processable insulating components, in the case where temperature of the cathode 2 becomes approximately 180° C. or more, a water cooling pipe is required for the purpose of cooling this part, and consequently it becomes a serious cost.

Next, the apparatus disclosed in U.S. Pat. No. 4,264,393 will be described. In this apparatus, the number of the gas introduction pipe from the gas supply source to the chamber is one; however, the gas introduction pipe is branched into a plurality of gas introduction pipes which are the same as the number of discharge spaces in order to supply gas to the plurality of discharge spaces in the chamber. This can reduce cost of piping outside the chamber.

However, in the case where gas is simultaneously supplied to a plurality of discharge spaces, when piping lengths for introducing gas are largely different as shown in the drawing, the gas cannot be equally introduced into the respective discharge spaces. If the gas is evenly introduced into the respective discharge spaces with this configuration, a needle valve needs to be provided in each gas introduction pipe after branching as in the apparatus shown in FIG. 5, and consequently it becomes a serious cost.

SUMMARY OF THE INVENTION

The present invention has been devised in view of such circumstances, and it is an object of the embodiment(s) to provide a plasma processing apparatus which can evenly introduce reactive material gas into a plurality of discharge spaces in the plasma processing apparatus in which a plurality of sets of cathode-anode bodies for performing plasma discharge by reactive material gas are provided inside the chamber, and a semiconductor device manufactured by this plasma processing apparatus.

According to one aspect of the embodiment(s), there is provided a plasma processing apparatus comprising a sealable chamber, a gas supply source of reactive material gas, placed outside the chamber, a gas introduction pipe connected to the gas supply source, for introducing the material gas into the chamber, and a plurality of sets of cathode-anode bodies for forming a plurality of discharge spaces which perform plasma discharge of the material gas in the chamber, wherein the gas introduction pipe includes a gas branch section arranged in the chamber, a main pipe for connecting the gas supply source to the gas branch section, and a plurality of branch pipes connected from the main pipe to each of the discharge spaces via the gas branch section, and the branch pipes are configured so that conductances thereof are substantially equivalent to each other.

Here, the conductance of the branch pipe refers to the degree that gas easily flows through the branch pipe. The term "conductances are substantially equivalent to each other" means that the differences in conductances of the plurality of branch pipes are within approximately 10% each other.

According to another aspect of the embodiment(s), there is provided a semiconductor device manufactured by the plasma processing apparatus according to the aforementioned aspect.

According to still another aspect of the embodiment(s), there is provided a method of manufacturing a semiconductor device by the plasma processing apparatus according to the aforementioned aspect.

DESCRIPTION OF THE PREFERRED EMBODIMENTS

In the plasma processing apparatus according to an embodiment, the gas introduction pipe includes the gas branch section arranged in the gas supply source and the chamber, the main pipe for connecting the gas supply source to the gas branch section, and the plurality of branch pipes connected from the main pipe to each of the discharge spaces via the gas branch section, and the branch pipes are configured so that conductances thereof are substantially equivalent to each other.

That is, it is configured so that that the differences in conductances of the plurality of branch pipes are within approximately 10% each other, and therefore gas can be evenly supplied to the plurality of discharge spaces in the chamber by the main pipe, the gas branch section, and the branch pipes of the gas introduction pipe without providing a special conductance adjustment mechanism.

In the semiconductor device according to another embodiment, since the semiconductor device is manufactured by a plasma processing apparatus which can evenly supply gas to a plurality of discharge spaces in a chamber, there is little variation in quality.

In the method of manufacturing a semiconductor device according to still another embodiment, since the plasma processing apparatus which can evenly supply gas to a plurality of discharge spaces in a chamber is used, the semiconductor device can be manufactured with little variation in quality.

In the plasma processing apparatus according to the one or more embodiments, for example, the gas branch section may he made up of a disk shaped body having an internal flow passage for communicating the main pipe with branch pipes. When the gas branch section is made up of such disk shaped body, gas flow from the main pipe into the internal flow passage of the disk shaped body is evenly distributed to each of the branch pipes and therefore gas can be evenly supplied to the plurality of discharge spaces in the chamber by the simply configured disk shaped body.

The internal flow passage of the disk shaped body may be composed of, for example, one gas inlet port provided at the center portion of the disk shaped body, a plurality of gas passages which are communicated with the gas inlet port and arranged so as to reach the periphery portion of the disk shaped body, and a plurality of gas outlet ports provided in the periphery portion of the disk shaped body so as to be communicated with each of the gas passages. When the internal flow passage of the disk shaped body is such a configuration, gas can be evenly supplied to the plurality of discharge spaces in the chamber with simpleness and sureness by connecting the main pipe of the gas introduction pipe to the gas inlet port and by connecting the plurality of branch pipes to each of the gas outlet ports.

The plasma processing apparatus according to one or more embodiments may be such that, for example, the number of discharge spaces is two, the number of cathode-anode bodies is two sets, and the number of branch pipes is two. Alternatively, the number of discharge spaces is three, the number of cathode-anode bodies is three sets, and the number of branch pipes is three. Such configuration may be appropriately used taking account of a size of the plasma processing apparatus, processing capability, processing cost, and the like.

The plasma processing apparatus according to one or more embodiments uses, for example, a configuration in which the gas introduction pipe has a part disposed at least in the chamber, being made of insulating material, According to thus configured gas introduction pipe, gas can be supplied to a cathode which inputs electric power.

The plasma processing apparatus according to one or more embodiments uses, for example, such a configuration in which the gas introduction pipe has a part of the main pipe disposed in the chamber, being made of metal material, and the gas branch section is made of metal material. According to thus configured plasma processing apparatus, the gas branch section can be sufficiently grounded, thereby suppressing influence of adjacent discharge space.

The plasma processing apparatus according to one or more embodiments uses, for example, the gas introduction pipe which has a part disposed at least in the chamber, being made of heat resistance material. According to thus configured gas introduction pipe, thermal influence of the gas introduction pipe in the chamber due to plasma discharge can be alleviated.

The plasma processing apparatus according to one or more embodiments uses, for example, the gas introduction pipe which has a part disposed at least in the chamber, being made of flexible material. According to thus configured gas introduction pipe, in the case where gas is supplied to the cathode which inputs electric power, the gas introduction pipe in the chamber has flexibility and therefore piping arrangement can be readily realized.

As for an example of the flexible material, polyethylene terephthalate resin may be used. According to the gas introduction pipe made of polyethylene terephthalate resin, in the case where gas is supplied to the cathode which inputs electric power, piping arrangement can be readily realized with a relatively low cost. In addition, good heat resistance can be assured at a temperature of approximately 180° C. or less, which is a heat resistance temperature of the resin.

In the plasma processing apparatus of one or more embodiments, preferably, reactive material gas is mixed with at least one of fluorine-based etching gas, special high pressure gas, and hydrogen gas. According to such material gas, even in the case where material gas is supplied to the plurality of discharge spaces, gas piping length in the air can be shortened and a valve for adjusting flow rate and a portion thereof are not required to perform housing exhaust ventilation, and therefore safety can be improved while cost is reduced.

Aspects of the present invention will be described below based on three embodiments showing a plasma processing apparatus. It is to be noted that the present invention is not limited to these embodiments.

First Embodiment

Figure 1:
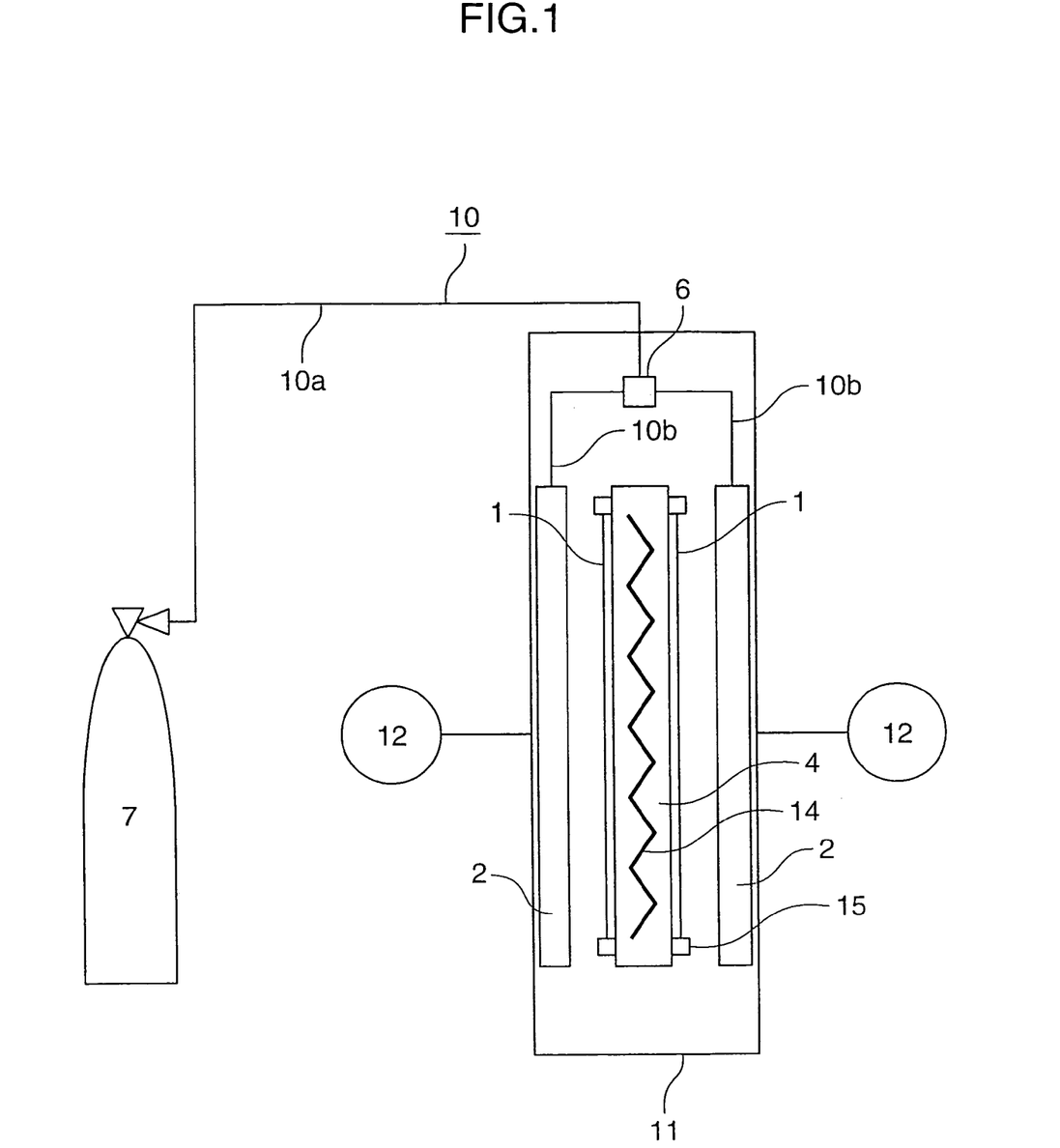
FIG. 1 is a schematic longitudinal sectional view showing a semiconductor device manufacturing apparatus according to a first embodiment of the present invention.

FIG. 1 is a schematic longitudinal sectional view showing a semiconductor device manufacturing apparatus as a plasma processing apparatus according to a first embodiment.

In the semiconductor device manufacturing apparatus, an anode 4 and cathodes 2, 2 are arranged so that the anode 4 is sandwiched by the cathodes 2, 2 with a predetermined interval in a horizontal direction. Then, plasma discharge is performed at spaces (two discharge spaces) between the anode 4 and each of the cathodes 2, 2 with reactive material gas introduced into a chamber 11.

The semiconductor device manufacturing apparatus will be more specifically described. That is, the semiconductor device manufacturing apparatus comprises the chamber 11 which is sealable vertical type as a reactive vessel, and one anode 4 is substantially vertically arranged with respect to a bottom surface of the chamber 11 at its inside center portion. Glass substrates 1, 1, which are materials to be processed, are arranged on both sides of the anode 4.

The chamber 11 uses stainless steel, aluminum alloy, or the like and uses ceramics or the like for thermal insulation. Further, in the chamber 11, the cathodes 2, 2 are arranged so to face the substrate 1, respectively. The anode 4 is made of material having conductivity and heat resistance, such as stainless steel, aluminum alloy, and carbon. Although not shown in FIG. 1, similar to FIG. 5, a pressure controller 22 and a vacuum pump 21 are provided in order to flexibly control pressure of reactive gas in the chamber, and a toxic substance elimination device 23 is provided in order to eliminate toxic substance in exhaust gas.

The substrates 1, 1 generally use a silicon substrate, a glass substrate, or the like; however, it is not limited to these substrates. Here, glass substrates 1, 1 are used. The anode 4 has dimensions suitably determined in accordance with those of the glass substrates 1, 1 for forming a thin film. Here, the anode 4 is designed to be dimensions in 1000 to 1500 mm×600 to 1000 mm with respect to those of the substrates 1, 1, 900 to 1200 mm×400 to 900 mm.

The anode 4 incorporates a heater 14 which performs control for heating the anode 4 to be the room temperature to 300° C. Here, the anode 4 uses a heater which incorporates an encapsulated type heating device such as a sheathed heater and an encapsulated type temperature sensor such as a thermocouple in an aluminum alloy, and the heater performs control for heating the anode to be the room temperature to 300° C.

The cathodes 2, 2 are made of stainless steel, aluminum alloy, or the like. Here, aluminum alloy is used. Dimensions of the cathode 2 are set to suitable values in accordance with those of the substrate 1 which performs film formation. Here, it is designed in 1000 to 1500 mm×600 to 1000 mm.

The semiconductor device manufacturing apparatus comprises a compressed gas tank 7 placed outside the chamber 11 as a gas supply source of reactive material gas, and a gas introduction pipe 10 connected to the compressed gas tank 7, for introducing material gas to the inside of the chamber 11.

The gas introduction pipe 10 includes a gas branch section 6 arranged in the chamber 11, one main pipe 10a which connects the compressed gas tank 7 to the gas branch section 6, and two insulative branch pipes 10b, 10b connected from the main pipe 10a to each of the discharge spaces via the gas branch section 6. Then, the branch pipes 10b, 10b are configured so that their lengths are equivalent to each other.

In this way, the gas introduction pipe 10 is branched in the chamber 11 in order to evenly supply material gas to two discharge spaces in the semiconductor device manufacturing apparatus. Gas to be introduced to the discharge space is introduced by the main pipe 10a which is of a single pipe, between the compressed gas tank 7 placed outside the chamber 11 and the gas branch section 6 disposed in the chamber 11. Since the gas introduction pipe 10 has a short piping length at the outside of the chamber 11 and has no valves, its configuration is extremely simple.

Material gas at the downstream side of the gas branch section 6 is introduced to each of the discharge spaces via the two branch pipes 10b, 10b. Here, taking account of insulativity and heat resistance, the branch pipes 10b, 10b are made of polytetrafluoroethylene resin, and alumina insulator is used at its cathode connection part.

Material gas is introduced into the discharge spaces via these two branch pipes 10b, 10b. Here, since the branch pipes 10b, 10b are configured so that distances from the gas branch section 6 to respective cathode connection parts becomes equivalent to each other, piping to both cathodes 2, 2 is relatively easy even in the case of the branch pipes having no flexibility like glass.

The inside of the cathodes 2, 2 are cavities. Material gas is introduced into these cavities from the compressed gas tank 7 via the main pipe 10a and the branch pipes 10b, 10b of the gas introduction pipe 10. Here, $SiH_4$ gas diluted with $H_2$ is used as material gas.

A number of through holes for supplying material gas introduced into the cavities disposed inside the cathodes 2, 2 to the surfaces of the substrates 1 are provided on the surfaces of the cathodes 2, 2 through a boring process. This boring process is desirable to make holes having a diameter of 0.1 mm to 2.0 mm at a pitch of several millimeters to several centimeters.

It is preferable to provide a distance of several millimeters to several tens of millimeters, between the cathodes 2, 2 and the anode 4. Here, the distance is 2 mm to 30 mm. Furthermore, distance accuracy within the surfaces is preferable to be within several percents. Here, it is confirmed that the accuracy is 1% or less.

Electric power is supplied to the cathodes 2, 2 by plasma excitation power supplies 12, 12. The plasma excitation power supplies 12, 12 use an AC electric power of 10 W to 100 kW at a frequency of 1.00 MHz to 60 MHz. Here, the power supplies use 10 W to 10 kW at 13.56 MHz to 60 MHz.

In the semiconductor device manufacturing apparatus as configured above, material gas is filled into a clearance between the cathodes 2, 2 and the anode 4 at a predetermined flow rate and pressure and high frequency power is applied to the cathodes 2, 2 and the anode 4, thereby generating a glow discharge region (plasma discharge region) between the cathodes 2, 2 and the anode 4. Then, an amorphous film or a crystalline film can be formed on the surfaces of the substrates 1, 1.

The plasma processing apparatus (semiconductor device manufacturing apparatus) according to the first embodiment comprises the chamber 11, the compressed gas tank 7, the gas introduction pipe 10, and two sets of cathode-anode bodies. The gas introduction pipe 10 includes the gas branch section 6 arranged in the chamber 11, one main pipe 10a which connects the compressed gas tank 7 to the gas branch section 6, and two insulative branch pipes 10b, 10b connected from the main pipe 10a to each of the discharge spaces via the gas branch section 6, and lengths of the branch pipes 10b, 10b are configured so as to be equivalent to each other. Consequently, gas can be evenly supplied to two discharge spaces in the chamber 11 by the main pipe 10a, gas branch section 6, and branch pipes 10b, 10b of the gas introduction pipe 10 without providing a special conductance adjustment mechanism, whereby a semiconductor device such as a solar cell using a semiconductor thin film or an optical thin film, a thin film transistor (TFT), a photosensitive member can be efficiently obtained at low cost.

Second Embodiment

Figure 2:
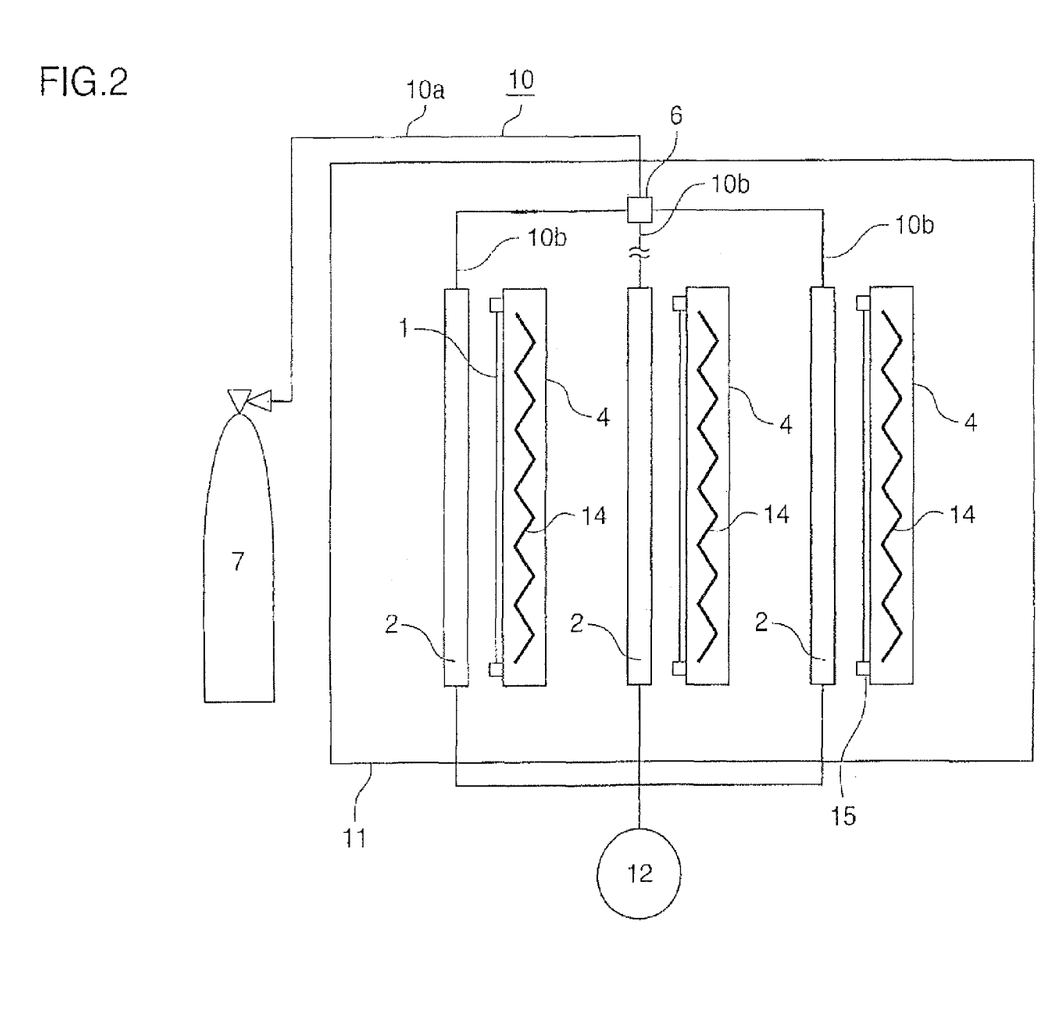
FIG. 2 is a schematic longitudinal sectional view showing a semiconductor device manufacturing apparatus according to a second embodiment of the present invention.

FIG. 2 is a schematic longitudinal sectional view showing a semiconductor device manufacturing apparatus as a plasma processing apparatus according to a second embodiment.

In a sealable vertical chamber 11, three sets of cathode-anode bodies are substantially vertically arranged with respect to a bottom surface of the chamber 11. Then, plasma discharge is performed at spaces (three discharge spaces) between the anodes 4 and the cathodes 2 in the cathode-anode bodies with reactive material gas introduced into the chamber 11. The cathode-anode bodies are made up of three sets for simplification in FIG. 2; however, it is not limited to this. The anode 4 in the cathode-anode bodies is made of material having conductivity and heat resistance, such as stainless steel, aluminum alloy, and carbon.

Although not shown in FIG. 2, similar to FIG. 5, a pressure controller 22 and a vacuum pump 21 are provided in order to flexibly control pressure of reactive gas in the chamber, and a toxic substance elimination device 23 is provided in order to eliminate toxic substance in exhaust gas.

The glass substrate 1 which is a material to be processed is arranged on left side of each anode 4. The substrate 1 generally uses a silicon substrate, a glass substrate, or the like; however, it is not limited to these substrates. Here, a glass substrate is used. The anode 4 has dimensions suitably determined in accordance with those of the glass substrate 1 for forming a thin film. Here, the anode 4 is designed to be dimensions in 1000 to 1500 mm×600 to 1000 mm with respect to those of the substrate 1, 900 to 1200 mm×400 to 900 mm.

The anode 4 incorporates a heater 14 which performs control for heating the anode 4 to be the room temperature to 300° C. Here, the anode 4 uses a heater which incorporates an encapsulated type heating device such as a sheathed heater and an encapsulated type temperature sensor such as a thermocouple in an aluminum alloy, the heater performs control for heating the anode between the room temperature and 300° C.

The cathodes 2 are made of stainless steel, aluminum alloy, or the like. Here, aluminum alloy is used. Dimensions of the cathode 2 are set to suitable values in accordance with those of the substrate 1 which performs film formation. Here, it is designed in 1000 to 1500 mm×600 to 1000 mm.

The semiconductor device manufacturing apparatus comprises a compressed gas tank 7 as a gas supply source of material gas placed outside the chamber 11, and a gas introduction pipe 10 connected to the compressed gas tank 7, for introducing material gas into the chamber 11.

The gas introduction pipe 10 includes a gas branch section 6 arranged in the chamber 11, one main pipe 10a which connects the compressed gas tank 7 to the gas branch section 6, and three insulative branch pipes 10b, 10b, 10b connected from the main pipe 10a to each of the discharge spaces via the gas branch section 6. Then, the branch pipes 10b, 10b, 10b are configured so that their lengths are equivalent to each other.

The inside of the cathodes 2, 2, 2 are cavities. Material gas is introduced into these cavities from the compressed gas tank 7 via the main pipe 10a and the branch pipes 10b, 10b, 10b of the gas introduction pipe 10. Material gas (here, $SiH_4$ gas diluted with $H_2$) is introduced by the main pipe 10a which is of a single pipe, between the compressed gas tank 7 and the gas branch section 6. After branched at the gas branch section 6, the gas is introduced into the cavities disposed inside the cathodes 2 via the branch pipes 10b, 10b, 10b which are made of polytetrafluoroethylene resin.

Here, the branch pipes 10b, 10b, 10b use those which are made of flexible polytetrafluoroethylene resin, in order to be equivalent in distance from the gas branch section 6 to three cathodes 2, 2, 2 each other. This enables long piping to be arranged without difficulty and piping conductance to be matched with ease.

A number of through holes for supplying material gas introduced into the cavities disposed inside the cathodes 2, 2, 2 to the substrates 1 are provided on the surfaces of the cathodes 2, 2, 2 by the same or similar boring process as in the first embodiment.

Distances between the cathode 2 and the anode 4 in each of the cathode-anode bodies and distance accuracy within the surfaces are the same or similar as the first embodiment. Electric power is supplied to the cathodes 2, 2, 2 by the plasma excitation power supplies 12 as in the same or similar condition of the first embodiment.

In the plasma processing apparatus as configured above, material gas is filled into a clearance between the cathode 2 and the anode 4 at a predetermined flow rate and pressure, and high frequency power is applied to a gap between the cathode 2 and the anode 4, thereby generating a glow discharge region (plasma discharge region) between the cathode 2 and the anode 4. Then, an amorphous film or a crystalline film can be formed on the surfaces of the substrates 1, 1, 1.

More specifically, $SiH_4$ diluted with $H_2$ is used as material gas and film forming time is set to 10 minutes, whereby silicon thin film having a film thickness of 300 nm can be deposited in a film thickness distribution of within ±10%.

The plasma processing apparatus (semiconductor device manufacturing apparatus) according to the second embodiment comprises the chamber 11, the compressed gas tank 7, the gas introduction pipe 10, and three sets of cathode-anode bodies. The gas introduction pipe 10 includes the gas branch section 6 arranged in the chamber 11, one main pipe 10*a* which connects the compressed gas tank 7 to the gas branch section 6, and three insulative branch pipes 10*b*, 10*b*, 10*b* connected from the main pipe 10*a* to each of the discharge spaces via the gas branch section 6, and lengths of the branch pipes 10*b*, 10*b*, 10*b* are configured so as to be equivalent to each other.

Consequently, gas can be evenly supplied to the discharge spaces in the chamber 11 by the main pipe 10*a*, gas branch section 6, and branch pipes 10*b*, 10*b*, 10*b* of the gas introduction pipe 10 without providing a special conductance adjustment mechanism, whereby a semiconductor device such as a solar cell using a semiconductor thin film or an optical thin film, a TFT, a photosensitive member can be efficiently obtained at low cost.

Third Embodiment

Figure 3:
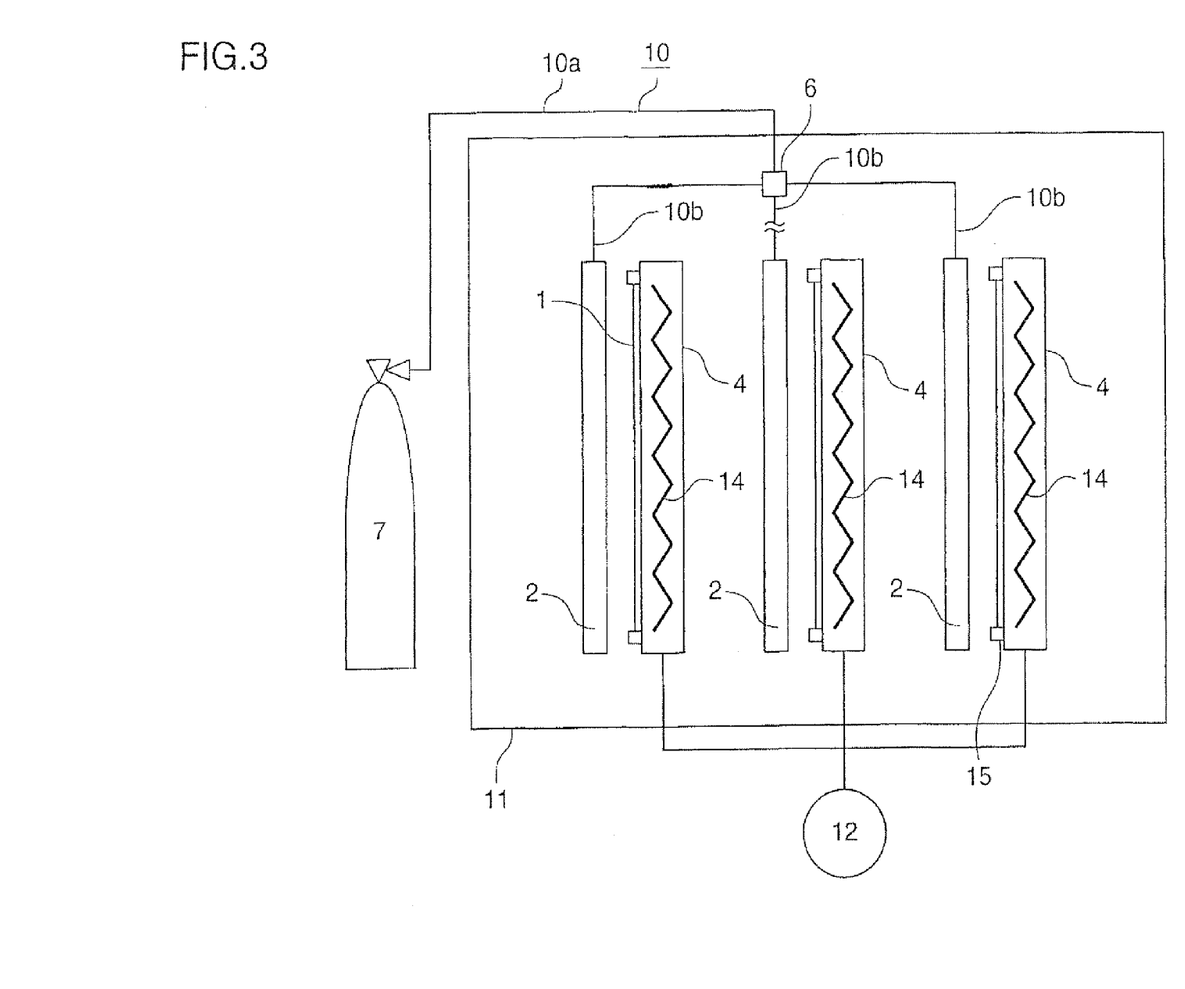
FIG. 3 is a schematic longitudinal sectional view showing a semiconductor device manufacturing apparatus according to a third embodiment of the present invention.

FIG. 3 is a schematic longitudinal sectional view showing a semiconductor device manufacturing apparatus as a plasma processing apparatus according to a third embodiment.

The semiconductor device manufacturing apparatus of FIG. 3 has the same or similar configuration as the second embodiment, but uses material gas different from that of the second embodiment. That is, this semiconductor device manufacturing apparatus uses gas fluorine-based material gas (here, $NF_3$) diluted with inert gas (here, Ar) for etching apparatus. Electric power is supplied to the cathodes 2, 2, 2 by the plasma excitation power supplies 12 as in the same or similar condition of the first embodiment.

According to this semiconductor device manufacturing apparatus, etching of silicon film can be performed on the surface of the substrates 1, 1, 1 at a speed of 10 nm/s or more.

The plasma processing apparatus (semiconductor device manufacturing apparatus) according to the third embodiment is configured as the same or similar structure of the second embodiment. Consequently, gas can be evenly supplied to two discharge spaces in the chamber 11 by the main pipe 10*a*, gas branch section 6, and branch pipes 10*b*, 10*b*, 10*b* of the gas introduction pipe 10 without providing a special conductance adjustment mechanism, whereby a semiconductor device such as a solar cell using a semiconductor thin film or an optical thin film, a TFT, a photosensitive member can be efficiently obtained at low cost. Further, dry etching etc. of a plurality of films can be efficiently performed by using material gas of $NF_3$ diluted with Ar.

Figure 4:
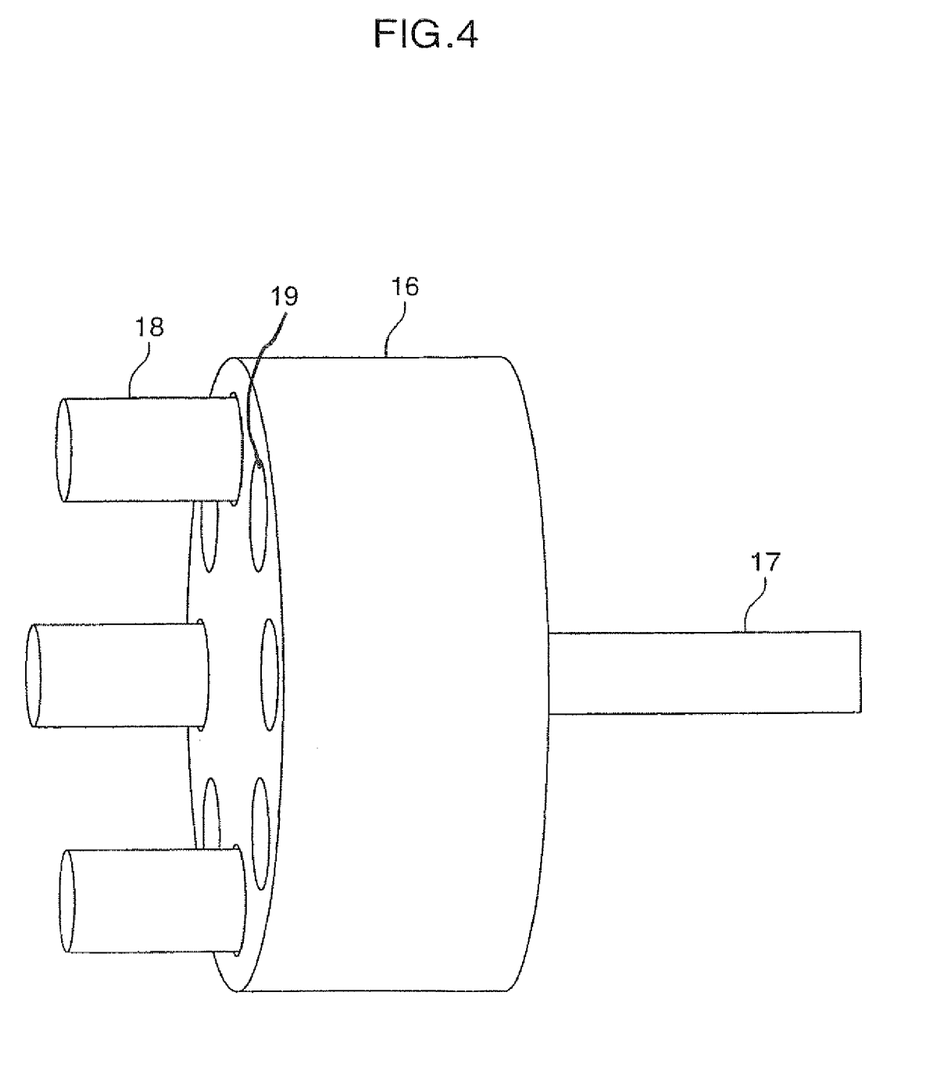
FIG. 4 is a schematic view showing a gas branch component used in a gas branch section according to the first to third embodiments of the present invention.

FIG. 4 is a schematic view showing a gas branch component that can be used in the gas branch section 6 according to the first to third embodiments.

This branch component is made up of a disk shaped body 16 having the internal flow passage for communicating the main pipe 10*a* with the branch pipe 10*b*. The internal flow passage of the disk shaped body 16 includes one gas inlet port provided at the center portion of the disk shaped body 16, eight gas passages which are communicated with the gas inlet port and arranged so as to reach the periphery portion of the disk shaped body 16, and eight gas outlet ports provided in the periphery portion of the disk shaped body 16 so as to be communicated with each of the gas passages.

An end part 17 of the main pipe 10*a* is connected to the gas inlet port and any number of end parts 18 of the branch pipes 10*b* is connected to those gas outlet ports. Furthermore, of those gas outlet ports, closure members 19 which close the gas outlet ports are inserted into the outlet ports where the end parts 18 of the branch pipes 10*b* are not connected.

What is claimed is:

1. A plasma processing apparatus, comprising:
a sealable chamber;
a gas supply source of reactive material gas, placed outside the chamber;
a gas introduction pipe connected to the gas supply source, for introducing the material gas into the chamber;
a plurality of sets of cathode-anode bodies configured to form a plurality of discharge spaces which perform plasma discharge of the material gas in the chamber; and
a gas supply section comprising the plurality of cathodes of the cathode-anode bodies in which each cathode is provided with a plurality of through holes for supplying the material gas to an object to be plasma-processed, wherein
the gas introduction pipe includes a gas branch section arranged in the chamber, a main pipe for connecting the gas supply source to the gas branch section, and a plurality of branch pipes connected from the main pipe to the cathode-anode bodies via the gas branch section and each of the discharge spaces,
the gas branch section includes a plurality of internal flow passages arranged to communicate the main pipe with the plurality of branch pipes,
the plurality of internal flow passages are substantially equivalent in length with each other,
each internal flow passage is a passage within the gas branch section between an end of the main pipe and an end of one of the plurality of branch pipes,
the gas supply section is arranged opposite to the gas branch section connected by the branch pipes,
each cathode of the cathode-anode bodies is placed opposite to a corresponding anode so that a corresponding discharge space is formed therebetween, and
the branch pipes are made of flexible material, are connected with cathodes of the cathode-anode bodies, and are configured so that lengths between the gas branch section and the cathodes are equivalent to each other, and flow conductances of the branch pipes are substantially equivalent to each other.

2. The plasma processing apparatus according to claim 1, wherein the gas branch section comprises a disk shaped body having the plurality of internal flow passages for communicating the main pipe with the plurality of branch pipes.

3. The plasma processing apparatus according to claim 2, wherein the disk shaped body comprises:
- a gas inlet port provided at the center portion of the disk shaped body to be communicated with the internal flow passages; and
- a plurality of gas outlet ports provided in a periphery portion of the disk shaped body so as to be communicated with the plurality of internal flow passages.

4. The plasma processing apparatus according to claim 1, wherein a number of the discharge spaces is two, a number of the cathode-anode bodies is two sets, and a number of the branch pipes is two.

5. The plasma processing apparatus according to claim 1, wherein a number of the discharge spaces is three, a number of the cathode-anode bodies is three sets, and a number of the branch pipes is three.

6. The plasma processing apparatus according to claim 1, wherein the gas introduction pipe has a part disposed at least in the chamber, being made of insulating material.

7. The plasma processing apparatus according to claim 1, wherein the gas introduction pipe has a part of the main pipe disposed in the chamber, being made of metal material, and the gas branch section is made of metal material.

8. The plasma processing apparatus according to claim 1, wherein the gas introduction pipe comprises a part disposed at least in the chamber, being made of heat resistance material.

9. The plasma processing apparatus according to claim 3, wherein the disk shaped body further comprises a plurality of closure members corresponding to the plurality of gas outlet ports, each closure member arranged to close the corresponding gas outlet port when the gas outlet port is not in communication with the corresponding internal flow passage.

10. The plasma processing apparatus according to claim 1, wherein the plurality of branch pipes are made of electrically insulating material.

11. The plasma processing apparatus according to claim 1, wherein each of the plurality of branch pipes is in communication with a corresponding cathode of the gas supply section, each branch pipe being arranged to supply the material gas to the corresponding cathode which in turn is arranged to supply the material gas to a corresponding discharge space.

12. The plasma processing apparatus according to claim 11, wherein the each cathode has at least one cavity disposed therein so that the material gas is introduced into the at least one cavity of the cathode and at least one through hole of the plurality of through holes in communication with the at least one cavity so that the material gas introduced into the at least one cavity is supplied to the corresponding discharge space via the at least one through hole.

13. The plasma processing apparatus according to claim 12, wherein the plurality of through holes are such that a diameter of each through hole is substantially in a range between 0.1 mm and 0.2 mm and a pitch between two through holes is substantially in a range between several mm to several cm.

14. The plasma processing apparatus according to claim 1, wherein the cathodes and the anodes are rectangular in shape.

15. The plasma processing apparatus according to claim 14, wherein dimensions of the cathodes and the anodes are substantially in a range 1000 to 1500 mm×600 to 1000 mm.

16. The plasma processing apparatus according to claim 14, wherein there are plural cathodes and each cathode faces a corresponding anode to form a corresponding discharge space therebetween.

17. The plasma processing apparatus according to claim 1, the number of cathodes and the number of discharge spaces are equal.

18. The plasma processing apparatus according to claim 1, wherein there is no flow conductance adjustment mechanism for any of the branch pipes.

19. The plasma processing apparatus according to claim 1, wherein no valves are separately provided on any of the branch pipes between the gas branch section and the gas supply section.

20. A plasma processing apparatus, comprising:
- a sealable chamber;
- a gas supply source of reactive material gas, placed outside the chamber;
- a gas introduction pipe connected to the gas supply source, for introducing the material gas into the chamber;
- a plurality of sets of cathode-anode bodies configured to form a plurality of discharge spaces which perform plasma discharge of the material gas in the chamber; and
- a gas supply section comprising the plurality of cathodes of the cathode-anode bodies in which each cathode is provided with a plurality of through holes for supplying the material gas to an object to be plasma-processed, wherein
- the gas introduction pipe includes a gas branch section arranged in the chamber, a main pipe for connecting the gas supply source to the gas branch section, and a plurality of branch pipes connected from the main pipe to the cathode-anode bodies via the gas branch section and each of the discharge spaces,
- the gas branch section comprises a disk shaped body having a plurality of internal flow passages which communicate the main pipe with the plurality of branch pipes,
- the plurality of internal flow passages of the disk shaped body being substantially equivalent in length with each other,
- each internal flow passage being a passage within the disk shaped body between an end of the main pipe and an end of one of the plurality of branch pipes,
- the gas supply section is arranged opposite to the gas branch section connected by the branch pipes,
- each cathode of the cathode-anode bodies is placed opposite to a corresponding anode so that a corresponding discharge space is formed therebetween, and
- the branch pipes are made of flexible material, are connected with cathodes of the cathode-anode bodies, and are configured so that flow conductances of the branch pipes are substantially equivalent to each other.

* * * * *